United States Patent [19]

Brunel

[11] 3,824,408

[45] July 16, 1974

[54] DRIVER CIRCUIT

[75] Inventor: L. E. Andre Brunel, Ottawa, Ontario, Canada

[73] Assignee: Microsystems International Limited, Montreal, Quebec, Canada

[22] Filed: July 20, 1973

[21] Appl. No.: 381,257

[52] U.S. Cl. ............. 307/214, 307/260 A, 307/268, 307/270, 307/300

[51] Int. Cl. ............................................ H03k 19/40

[58] Field of Search ....... 307/214, 260 A, 268, 270, 307/300

[56] References Cited

UNITED STATES PATENTS

| | | | |
|---|---|---|---|
| 3,602,735 | 8/1971 | Lodi | 307/214 |
| 3,641,362 | 2/1972 | Gamble | 307/300 X |

*Primary Examiner*—John Zazworsky
*Attorney, Agent, or Firm*—E. E. Pascal

[57] ABSTRACT

A high speed inverting driver circuit, having a pair of serially arranged bipolar transistors in its output stage, for providing an interface between low level logic signals and a load. During operation of said driver circuit a logic gate, which is coupled to the base electrode of a bipolar transistor switch bridging the base and emitter electrodes of one transistor in the output stage, compares the voltage signals appearing at the input and output terminals of the driver circuit. If, due to slow turn OFF of said one transistor in the output stage, said voltage signals are simultaneously at their logical "0" level (ground potential), the bipolar transistor switch is turned ON by a signal from the logic gate, and the base and emitter electrodes of said one transistor of the output stage are effectively joined. By joining the base and emitter electrodes via the transistor switch, as aforesaid, charge stored in the base region of said one transistor in the output stage is rapidly depleted and the turn OFF time of said one transistor thereby greatly reduced.

25 Claims, 2 Drawing Figures

DRIVER CIRCUIT

Figure 1:
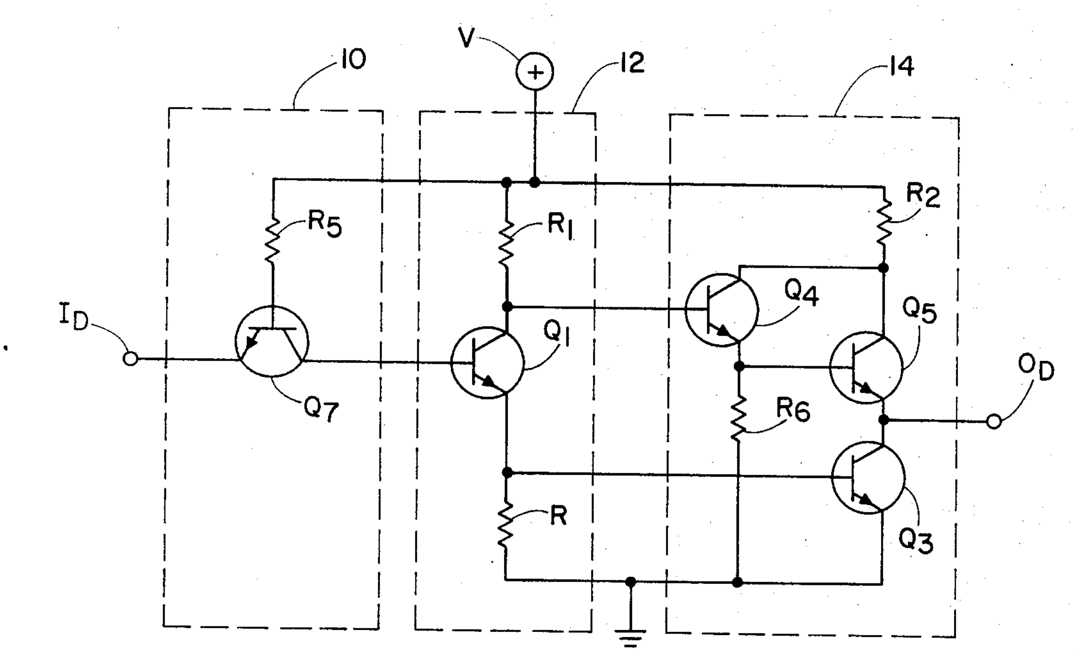
Fig. 1 (PRIOR ART)

This invention relates to high speed bipolar DTL and TTL driver circuits, and more particularly to a driver circuit having an output stage with a rapid turn OFF capability achieved with minimum compromise to the turn ON capability of said output stage.

Various Diode Transistor Logic (DTL) and Transistor-Transistor Logic (TTL) circuits are used to interface between standard logic signal sources and succeeding heavier load circuits which are often capacitive in nature. In their fundamental form these driver circuits comprise at least two bipolar transistors, serially arranged across a direct current supply, in the well known "totem pole" configuration, and driven by the collector and emitter circuits of another bipolar transistor arranged as a phase-splitter. To provide suitable base drive for said other transistor, arranged as a phase splitter, both DTL and TTL input circuit arrangements are used.

In the DTL input circuit arrangement a diode and an input transistor are arranged, in the conventional manner common to logic gates designed for positive logic, to route current through the base emitter and collector emitter circuits of said input transistor to the base electrode of the phase splitter transistor or alternatively to route current through said diode to ground. The TTL input circuit, which has the advantage of greater speed over the DTL input circuit, generally comprises a transistor with one or more emitters having its collector electrode connected to the base electrode of the phase splitter transistor stage and its base electrode connected via a suitable resistor to the ungrounded terminal of a direct current supply.

Various schematic forms of DTL and TTL driver circuits may be found in "Analysis and Design of Integrated Circuits" (copyright 1967) prepared by the Motorola Engineering Staff and published by McGraw-Hill at pages 324 et seq. or in "Texas Instrument Series 54/74 Integrated Circuits" (SC8504—266) 1966 at pages 10, et seq.

In the abovementioned "totem pole" circuit the output signal is obtained at the junction of the emitter electrode of the "upper" transistor and the collector electrode of the "lower" transistor where the "upper" and "lower" transistors are the serially arranged transistor pair which form part of the output stage of the driver circuit. When the "upper" transistor is conducting the "lower" transistor should be OFF and a logical "1" or "high" signal should appear at the output terminal of the driver circuit. Conversely when the "lower transistor is conducting the "upper" transistor should be OFF and a logical "0" or "low" output signal should appear at the output terminal of the driver circuit.

In the usual DTL and TTL driver circuits a logical signal appearing at the input terminal of one of said circuits appears at the output terminal of said circuit with a 180° phase reversal. When, for example, the logical signal appearing at the input terminal of a TTL driver circuit drops to its logical "0" state, such that the emitter electrode of the input stage transistor is connected to the circuit ground, the "upper" transistor of the output stage should turn ON or conduct and the "lower" transistor should turn OFF. If the "lower" transistor has saturated however, the "lower" transistor will be slow to turn OFF, and for a short period of time both the "upper" and "lower" transistors will be conducting thereby drawing a heavy current spike from the direct current supply energizing said driver circuit.

Because the turn OFF time of the "lower" transistor is controlled by the rate of depletion of the charge stored in the base region thereof, it is preferable that the resistor, which bridges the base and emitter electrodes of the "lower" transistor in conventional DTL and TTL circuits, has as low a resistance value as possible. The selection of the lower limit for this bridging resistor has to be a compromise, however, as too low a resistance value will seriously reduce the drive to the "lower" transistor and thereby increase the turn ON time for said "lower" transistor.

Since the voltage signals present at the input and output terminals of the driver circuit should be 180° out of phase, as aforesaid, a delayed turn OFF of the "lower" transistor can be readily detected by comparing the voltage levels present at the input and output terminal of the driver circuit. If, for example, the input signal drops to logical "0" (low) and the output signals remains at logical "0" (low), because of the slow turn-OFF of the "lower" transistor, and error condition exists which can be readily detected with conventional logic gates.

By detecting this error condition with a suitable logic gate and by using a corresponding error signal, appearing at an output terminal of said logic gate to turn ON a transistor which is connected across the base and emitter electrodes of said "lower" transistor, the charge in the base region of the "lower" transistor can be rapidly removed, and the turn OFF time of said "lower" transistor thereby greatly reduced. No compromise is required in this arrangement as the transistor, which is connected across the base emitter electrodes of the "lower" transistor to replace the bridging resistor connected across said base and emitter electrodes in the circuits of the prior art, is turned OFF while said "lower" transistor is being turned ON.

Thus in accordance with the present invention there is provided a driver circuit having an input terminal for connection to an input signal source, an output terminal for connection to a load circuit, and first and second supply terminals for connection to a direct current supply, said driver circuit further comprising; first, second, third and fourth bipolar transistors and a first resistor, the emitter electrode of the first transistor being connected to the collector electrode of the second transistor and to the base electrode of the third transistor, the collector electrode of the first transistor being connected to the base electrode of the fourth transistor and via the first resistor to the first supply terminal, the emitter electrode to the second and third transistors being connected to the second supply terminal of the collector electrode of the third transistor being connected to the output terminal; means connecting the collector electrode of the fourth transistor to the first supply terminal; diode means connecting the emitter electrode of the fourth transistor to the collector electrode of the third transistor; current routing means connected to the first supply terminal and linking the input terminal of the driver circuit to the base electrode of the first transistor, said routing means providing a current path from the first supply terminal to either the input terminal of the driver circuit or the base electrode of the first transistor; logic gate means having a first gate input terminal, a second gate input terminal, and a gate output terminal, the first gate input terminal being connected to the input terminal of the driver circuit, the second gate input terminal being connected to the output terminal of the driver circuit and the gate output terminal being connected to the base electrode of the second transistor.

Figure 2:
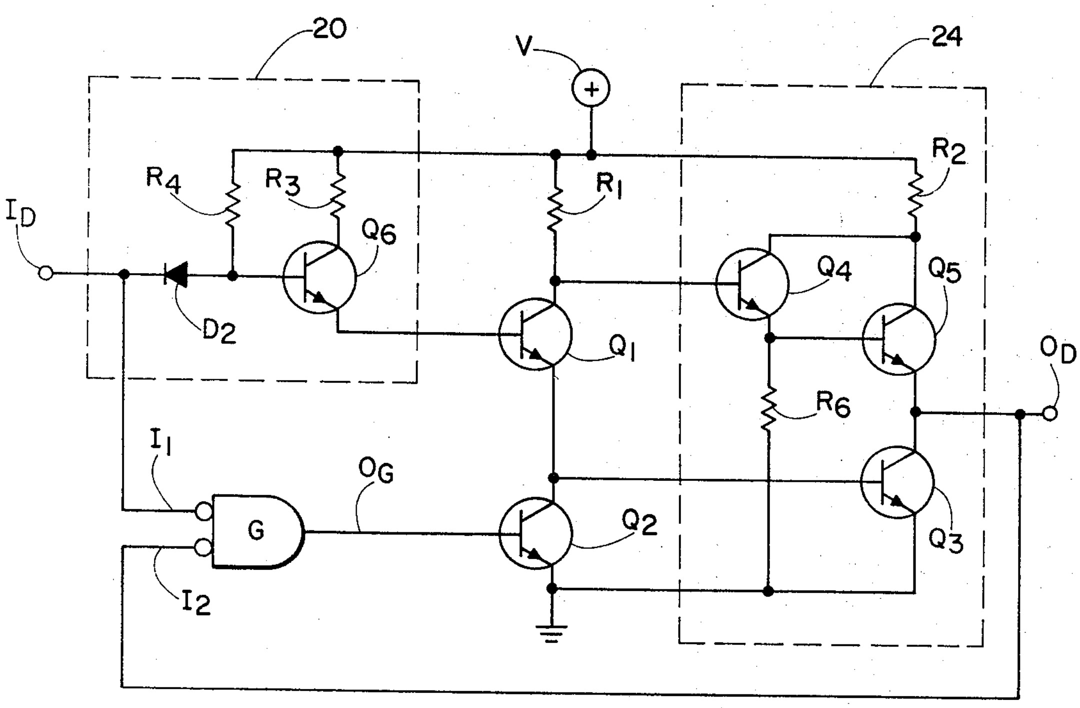

The invention will now be described with reference to the following drawings wherein:

FIG. 1 is a schematic drawing of a typical TTL driver circuit labelled as prior art;

FIG. 2 is a schematic drawing of a driver circuit in accordance with the present invention FIG. 1 of the drawings illustrates a typical TTL driver circuit commonly found in the art. This typical driver circuit has been divided into three functional stages; namely an input stage 10, a phase splitter stage 12 and an output stage 14. The input stage 10 comprises a seventh transistor $Q_7$ and a fifth resistor $R_5$ joining the base of the seventh transistor $Q_7$ to the first supply terminal V. The emitter electrode of the seventh transistor $Q_7$ is connected to the input terminal $I_D$ of the driver circuit while the collector electrode of the seventh transistor $Q_7$ is connected to the base electrode of the first transistor $Q_1$ of the following phase splitter stage 12. The input stage 10 may take other alternate forms. In one common form a multi-emitter transistor is used in place of the single emitter seventh transistor $Q_7$. The use of a multi-emitter transistor in place of the seventh transistor $Q_7$ is a convenient way of providing multiple inputs to the TTL stage. It should also be noted that the input stage 10 may also have the DTL circuit form of the input stage 20 of the circuit of FIG. 2.

As illustrated in FIG. 2, the DTL form of input stage 20 comprises a sixth transistor $Q_6$, a second diode $D_2$ and third and fourth resistors $R_3$ and $R_4$. The base electrode of the sixth transistor $Q_6$ is connected to the anode electrode of the second diode $D_2$ and via a fourth resistor $R_4$ to the first supply terminal V, while the collector electrode of said sixth transistor $Q_6$ is connected via a third resistor $R_3$ to said first supply terminal V. The cathode electrode of the second diode $D_2$ is connected to the input terminal $I_D$ of the driver circuit and the emitter electrode of the sixth transistor $Q_6$ is connected to the base electrode of the first transistor $Q_1$. It should be noted that corresponding elements in the circuits of FIGS. 1 and 2 bear the same designations for ease of comparison.

Returning now to FIG. 1, and to the phase splitter stage 12, it can be seen that the phase splitter stage 12 comprises a first transistor $Q_1$, a first resistor $R_1$ and a resistor R. The first resistor $R_1$ connects the collector electrode of the first transistor $Q_1$ to the first supply terminal V while resistor R connects the emitter electrode of said first transistor $Q_1$ to the second supply terminal (designated as ground in FIGS. 1 and 2). The base electrode of the first transistor $Q_1$ is connected to either the collector electrode of the seventh transistor $Q_7$, when a TTL form of input stage is used, or to the emitter electrode of the sixth transistor $Q_6$ when a DTL form of input stage is used. The collector and emitter electrodes of the first transistor $Q_1$, are respectively connected to the base electrode of the fourth transistor $Q_4$ and to the base electrode of the third transistor $Q_3$ of the output stage 14, to couple opposite phase voltage signals from the collector and emitter circuits of the first transistor $Q_1$ to the output stage.

As illustrated in FIG. 1, one form of the output stage 14 comprises third, fourth and fifth transistors $Q_3$, $Q_4$, $Q_5$ and second and sixth resistors $R_2$, $R_6$. The second resistor $R_2$ and the collector emitter junctions of the fifth and third transistors $Q_5$, $Q_3$ form a series circuit bridging the first supply terminal V and the second supply terminal (ground). The collector and emitter electrodes of the fourth transistor $Q_4$ are respectively connected to the collector and base electrodes of the fifth transistor $Q_5$. The output terminal of the driver circuit is connected to the junction of the emitter electrode of the fifth transistor $Q_5$ and the collector electrode of the third transistor $Q_3$ while the base electrodes of the fourth transistor $Q_4$ and the third transistor $Q_3$ are respectively connected to the collector and emitter electrodes of the first transistor $Q_1$ as aforesaid. The sixth resistor $R_6$ connects the base electrode of the fifth transistor to ground, to discharge the base region of said fifth transistor during turn OFF of said fifth transistor. Note the earlier referred to "lower" and "upper" transistor respectively correspond to the third and fifth transistors $Q_3$, $Q_5$ as shown in the drawings. If, however a diode is used in place of transistor $Q_5$, as explained subsequently, the "upper" transistor would be the fourth transistor $Q_4$.

Other versions of the output stage 14 illustrated in FIG. 1 may also be used. One common circuit variation, which is not shown in the drawings, replaces the fifth transistor $Q_5$ with a first diode $D_1$. The first diode $D_1$ is poled in the same direction of the emitter-base diode junction of the fourth transistor $Q_4$. When said fourth transistor $Q_4$ is a npn type transistor the anode of the first diode $D_1$ is connected to the emitter electrode of the fourth transistor $Q_4$ and the cathode of said first diode $D_1$ is connected to the output terminal $O_D$ of the TTL driver circuit. If pnp type transistors are used in the TTL driver circuit of FIG. 1, the cathode of the first diode $D_1$ would be connected to the emitter electrode of the fourth transistor $Q_4$. Another common variation, of the output stage 14 of the TTL driver circuit illustrated in FIG. 1, which is also not shown in the drawings, dispenses with the second resistor $R_2$ and directly connects the collector electrodes of the fourth $Q_4$ and fifth $Q_5$ transistors to the first supply terminal V.

The teachings of the present invention, as applied to one embodiment of a driver circuit, are illustrated schematically in the driver circuit of FIG. 2. As the input stage 20 illustrated in FIG. 2 has a DTL form which was previously described, in the description of the circuit of FIG. 1, no further description of said input stage 20 is deemed necessary. It should be noted, however, that said input stage 20 can be readily interchanged with the TTL form of input stage 10 illustrated in FIG. 1. Furthermore because the output stage 24, illustrated in FIG. 2, is identical in structure to the output stage 14, illustrated in FIG. 1, no additional structural description of said output stage is believed necessary. It being understood, of course, that circuit variations in the output stage 14, suggested in the description of the circuit illustrated in FIG. 1 can also be incorporated in the design of the output stage 24 of FIG. 2.

Aside from the alternatives mentioned with regards to the input and output stages, a comparison of the circuits of FIGS. 1 and 2 reveals the following differences. In place of resistor R, forming part of the phase splitter stage 12 of FIG. 1, the collector emitter junction of a second transistor $Q_2$ is connected in shunt with the base and emitter electrodes of the third transistor $Q_3$ of the output stage 24 in FIG. 2. Additionally a dual input logic gate G, having a first gate input terminal $I_1$ connected to the input terminal $I_D$ of the driver circuit, a second gate input terminal $I_2$ connected to the output terminal $O_D$ of the driver circuit and a gate output terminal $O_G$ connected to the base electrode of the second transistor $Q_2$, has been added to compare the voltage levels present at the input $I_D$ and output $O_D$ terminals of the driver circuit. Although the dual input logic gate G is shown as a dual input AND gate with inverting inputs, various other logic equivalent can be used as the function of said logic gate G is to supply current to the base electrode of the second transistor $Q_2$ only when both the input $I_D$ and output $O_D$ driver terminals are at ground potential (logical 0). One alternative to the dual input AND gate with inverting inputs is a dual input NOR gate.

To understand the operation of the circuit illustrated in FIG. 2 assume that the input signal source, provides a "high" or logical "1" input voltage level to the input terminal $I_D$ of the driver circuit. If the input terminal $I_D$ is "high," current will flow, from the first supply terminal V, via the third resistor $R_3$ and the collector emitter junction of the sixth transistor $Q_6$, through the base emitter junction of the first transistor $Q_1$, and the base emitter junction of the third transistor $Q_3$ to ground. This flow of current through the base emitter junctions of the first and third transistors $Q_1$, $Q_3$ turns ON the first and third transistors and pulls the voltage level appearing at the output terminal $O_D$ down to ground. Because current flowing through the first resistor $R_1$ is shunted to ground via the first $Q_1$ and third $Q_3$ transistors, the fourth $Q_4$ and fifth $Q_5$ transistors remain OFF or non conducting.

As in accordance with our assumption, the logic signal at the input terminal $I_D$ is high, and as the logic signal at the output terminal $O_D$ is accordingly low as described above, the first and second input terminals $I_1$, $I_2$ of the dual input logic gate G (AND gate with inverting inputs in the present example) will be at their logical "1" and logical "0" levels respectively. Accordingly, the logic signal at the output terminal $O_G$ of said logic gate G will be at its logical "0" state and substantially no current will be supplied to the base electrode of the second transistor $Q_2$. Consequently the second transistor $Q_2$ will be non-conducting and the emitter current of the first transistor $Q_1$ will flow directly through the base emitter junction of the third transistor $Q_3$. Such being the situation, the use of the second transistor $Q_2$, instead of the bridging resistor R of the prior art, will not effect the turn ON time of the third transistor $Q_3$.

Assume now that the voltage level appearing at the input terminal $I_D$ of the driver circuit has changed, from its previously assumed logical "1" level, to the logical "0" level. When the cathode electrode of the second diode $D_2$ is connected to ground (logical "0" level) the current supplied to the base electrode of the first transistor $Q_1$ is interrupted along with the current supplied to the base electrode of the third transistor $Q_3$. As the first transistor $Q_1$ ceases to conduct, current carried by the first resistor $R_1$ is primarily rerouted through the base emitter junctions of the fourth and fifth transistor $Q_4$, $Q_5$ thereby turning ON said fourth and fifth transistors $Q_4$, $Q_5$. As soon as the fourth and fifth transistors $Q_4$, $Q_5$ turn ON the potential on the output terminal $O_D$ of the driver circuit attempts to rise to the potential of the first supply terminal V.

In the prior art TTL circuit of FIG. 1 the third transistor $Q_3$ remains conducting, even after the flow of current to the base emitter junction of the third transistor $Q_3$ is interrupted, until the charge stored in the base region of the third transistor $Q_3$ has been discharged through resistor R. Consequently, when the input signal from the input signal source (not shown) drops to its logical "0" level and the output voltage attempts to rise accordingly to the logical "1" level as the fifth transistor $Q_5$ turns ON, a heavy current spike passes through the fifth and third transistors $Q_5$, $Q_3$. As this heavy current spike, which is caused by the failure of the third transistor $Q_3$ to turn OFF quickly, is undersirable, a second resistor $R_2$ is usually added to limit the current flow through the third and fift transistors $Q_3$, $Q_5$.

In the driver circuit of FIG. 2 resistor R of FIG. 1 has been replaced by a second transistor $Q_2$ and a dual input logic gate G has been added as aforesaid. As a result of these circuit changes, if the voltage at the output terminal $O_D$ of the driver circuit remains low (logical "0"), after the voltage applied to the input terminal $I_D$ has dropped to its logical "0" state (low or ground), both inputs $I_1$ and $I_2$ of the dual input logic gate G will be low. With both inputs $I_1$, $I_2$ low, the output voltage at the output terminal $O_G$ of the dual input logic gate G rises to its logical "1" state and turns ON the second transistor $Q_2$. The second transistor $Q_2$, being turned ON, quickly discharges the base region of the third transistor $Q_3$ to force a rapid turn OFF of the third transistor $Q_3$.

Thus it can be seen that a rapid turn OFF of the third transistor $Q_3$ is achieved without increasing the turn ON time of said third transistor $Q_3$ through placement and logical control of a solid state switch, such as the second transistor $Q_2$, across the base and emitter electrodes of said third transistor $Q_3$.

Although npn type transistors are shown in the circuits of FIGS. 1 and 2, as these circuits designed for fabrication in integrated circuit form pnp type transistors can be used if said circuits are fabricated with discrete components and if the voltage polarities are reversed. In all the foregoing description positive logic is assumed, therefore the expressions logical "1" or "high" and logical "0" or "low" respectively refer to a positive voltage, and a voltage near or at ground.

What is claimed is:

1. A driver circuit having an input terminal for connection to an input signal source, an output terminal for connection to a load circuit, and first and second supply terminals for connection to a direct current supply, said driver circuit further comprising:

a. first, second, third and fourth bipolar transistors and a first resistor, the emitter electrode of the first transistor being connected to the collector electrode of the second transistor and to the base electrode of the third transistor, the collector electrode of the first transistor being connected to the base electrode of the fourth transistor and via the first resistor to the first supply terminal, the emitter electrode of the second and third transistors being connected to the second supply terminal and the collector electrode of the third transistor being connected to the output terminal;

b. means connecting the collector electrode of the fourth transistor to the first supply terminal;

c. diode means connecting the emitter electrode of the fourth transistor to the collector electrode of the third transistor;

d. current routing means connected to the first supply terminal and linking the input terminal of the driver circuit to the base electrode of the first transistor, said routing means providing a current path from the first supply terminal to either the input terminal of the driver circuit or the base electrode of the first transistor;

e. logic gate means having a first gate input terminal, a second gate input terminal, and a gate output terminal, the first gate input terminal being connected to the input terminal of the driver circuit, the second gate input terminal being connected to the output terminal of the driver circuit and the gate output terminal being connected to the base electrode of the second transistor.

2. The driver circuit as defined in claim 1 wherein the routing means comprises a sixth bipolar transistor, a second diode and a third and fourth resistors, the collector and base electrodes of said sixth transistor being respectively connected via the third and fourth resistors to the first supply terminal, the emitter electrode of the said sixth transistor being connected to the base electrode of the first transistor, and the base electrode of said sixth transistor being connected via said second diode to the input terminal of the driver circuit.

3. The driver circuit as defined in claim 1 wherein the routing means comprises a seventh bipolar transistor and a fifth resistor, the collector electrode of said seventh transistor being connected to the base electrode of the first transistor, the emitter electrode of said seventh transistor being connected to the input terminal of the driver circuit and the base electrode of said seventh transistor being connected via the fifth resistor to the first supply terminal.

4. The driver circuit as defined in claim 1 wherein the diode means is a first diode, said first diode being poles in the same direction as the base emitter diode junction of the fourth transistor.

5. The driver circuit as defined in claim 2 wherein the diode means is a first diode, said first diode being poled in the same direction as the base emitter diode junction of the fourth transistor.

6. The driver circuit as defined in claim 3 wherein the diode means is a first diode, said first diode being poled in the same direction as the base emitter diode junction of the fourth transistor.

7. The driver circuit as defined in claim 1 wherein the diode means is the base emitter diode junction of a fifth bipolar transistor, the base and collector electrodes of the fifth transistor being respectively connected to the emitter and collector electrodes of the fourth transistor, and the emitter electrode of said fifth transistor being connected to the output terminal of the driver circuit.

8. The driver circuit as defined in claim 2 wherein the diode means is the base emitter diode junction of a fifth bipolar transistor, the base and collector electrodes of said fifth transistor being respectively connected to the emitter and collector electrodes of the fourth transistor, and the emitter electrode of said fifth transistor being connected to the output terminal of the driver circuit.

9. The driver circuit as defined in claim 3 where the diode means is the base emitter diode junction of a fifth bipolar transistor, the base and collector electrodes of said fifth transistor being respectively connected to the emitter and collector electrodes of the fourth transistor, and the emitter electrode of said fifth transistor being connected to the output terminal of the driver circuit.

10. The driver circuit as defined in claim 5 wherein the means connecting the collector electrode of the fourth transistor to the first supply terminal is a second resistor.

11. The driver circuit as defined in claim 6 wherein the means connecting the collector electrode of the fourth transistor to the first supply terminal is a second resistor.

12. The driver circuit as defined in claim 8 wherein the means connecting the collector electrode of the fourth transistor to the first supply terminal is a second resistor.

13. The driver circuit as defined in claim 9 wherein the means connecting the collector electrode of the fourth transistor to the first supply terminal is a second resistor.

14. The driver circuit as defined in claim 5 wherein the collector electrode of the fourth transistor is directly connected to the first supply terminal.

15. The driver circuit as defined in claim 6 wherein the collector electrode of the fourth transistor is directly connected to the first supply terminal.

16. The driver circuit as defined in claim 8 wherein the collector electrode of the fourth transistor is directly connected to the first supply terminal.

17. The driver circuit as defined in claim 9 wherein the collector electrode of the fourth transistor is directly connected to the first supply terminal.

18. The driver circuit as defined in claim 5 wherein the logic gate means is a dual input AND gate with inverting inputs and wherein the first and second gate input terminals are connected to said inverting inputs.

19. The driver circuit as defined in claim 6 wherein the logic gate means is a dual input AND gate with inverting inputs and wherein the first and second gate input terminals are connected to said inverting inputs.

20. The driver circuit as defined in claim 8 wherein the logic gate means is a dual input AND gate with inverting inputs and wherein the first and second gate input terminals are connected to said inverting inputs.

21. The driver circuit as defined in claim 9 wherein the logic gate means is a dual input AND gate with inverting inputs and wherein the first and second gate input terminals are connected to said inverting inputs.

22. The driver circuit as defined in claim 5 wherein the logic gate means is a dual input NOR gate.

23. The driver circuit as defined in claim 6 wherein the logic gate means is a dual input NOR gate.

24. The driver circuit as defined in claim 8 wherein the logic gate means is a dual input NOR gate.

25. The driver circuit as defined in claim 9 wherein the logic gate means is a dual input NOR gate.

* * * * *